United States Patent [19]
Noel et al.

[11] Patent Number: 6,151,347
[45] Date of Patent: Nov. 21, 2000

[54] LASER DIODE AND METHOD OF FABRICATION THEREOF

[75] Inventors: Jean-Paul F. Noel, Stittsville; David M. Adams, Gloucester, both of Canada

[73] Assignee: Nortel Networks Corporation, Montreal, Canada

[21] Appl. No.: 09/093,399

[22] Filed: Jun. 9, 1998

Related U.S. Application Data

[63] Continuation-in-part of application No. 08/588,039, Jan. 17, 1996, abandoned.

[51] Int. Cl.[7] .................................................. H01S 5/00
[52] U.S. Cl. ............................ 372/45; 372/96; 372/45
[58] Field of Search .................................. 372/45, 46, 50, 372/96

[56] References Cited

U.S. PATENT DOCUMENTS 5,313,484  5/1994  Arimoto ........................................ 372/46
5,591,500  1/1997  Kawanishi ..................................... 428/641

FOREIGN PATENT DOCUMENTS 7-094806  4/1995  Japan .

OTHER PUBLICATIONS

Mayer et al, Electronic Materials Science: For Integrated Circuits in SI and GAAS, New York: MacMillan Publishing Co, 1990, inside back cover. (no month available), Jan. 1990.

Primary Examiner—Teresa M. Arroyo
Assistant Examiner—Q. P. Leung
Attorney, Agent, or Firm—Angela C. de Wilton

[57] ABSTRACT

A semiconductor laser device structure comprising an active region provided by a quantum well of an indirect bandgap material, the quantum well being divided laterally to form an active region comprising a two dimensional array of localized cells. Preferably the quantum well of indirect band gap material is selected from group IV semiconductor materials and comprises a silicon-germanium alloy. A silicon/silicon-germanium alloy multi-quantum well (MQW) structure is described. In a preferred embodiment, a Si/SiGe alloy MQW laser diode comprises a coplanar double grating configuration etched through the MQW structure to provide distributed feedback. The double intersecting grating structure functions to define an array of "cells" or regions of finite dimensions in the quantum well structure which "localize" carriers within the cells thereby enhancing the radiative emission probability. The grating also provides for combined gain-coupled and index-coupled distributed feedback. The diode structure is preferably designed using a suitable Si/SiGe alloy composition and QW layer thicknesses, to provide for lasing at wavelengths compatible with fiber optic communication applications.

46 Claims, 5 Drawing Sheets

LASER DIODE AND METHOD OF FABRICATION THEREOF

CROSS-REFERENCE TO RELATED APPLICATIONS

This is a continuation-in-part application of U.S. patent application Ser. No. 08/588,039, filed Jan. 17, 1996, now abandoned the contents of which are hereby incorporated herein by reference.

FIELD OF INVENTION

This invention relates to a laser diode, and a method of fabrication thereof.

BACKGROUND OF THE INVENTION

Semiconductor lasers have an important role as light sources for optical communication systems. By selecting appropriate semiconductor materials, conventionally III–V alloy compounds, lasers which emit in the wavelength range from 0.8 µm to 1.7 µm can be fabricated. At present, long haul optical fiber communication is based on operating wavelengths around 1.55 µm and 1.3 µm, the wavelengths at which single mode optical fibers have minimum attenuation and dispersion respectively. Lasers have advantages over light emitting diodes (LEDs) of providing a coherent, narrow bandwidth source, ideally suited for communications applications. Single mode, narrow linewidth light sources for optical communication are thus dominated by laser diodes fabricated from direct band gap, III–V semiconductor alloy materials, particularly InP/InGaAsP, which emit in this wavelength region. For example, by using low chirp, multiple quantum well (MQW) DFB lasers at 1.55 µm, 2.5 Gb/s transmission systems with a repeater span of 80 km are commercially available, and systems for practical long haul transmission at 10 Gb/s are under development. Shorter wavelength sources, e.g. GaAs/AlGaAs which emits at 0.9 µm, are used for short distance transmission.

The requirement for direct band gap materials, and group III–V semiconductors in particular, for laser sources is, of course, related to the fact that direct recombination of electrons and holes, resulting in radiative emission, occurs with high probability for a no-phonon or Δk=0 transition. Consequently the early development of LEDs used these materials, particularly GaAs. The conditions for stimulated emission are relatively easily obtained in III–V material by suitable pump means, resulting in development of the first laser diodes in the 1960s. In comparison with Fabry-Perot configurations, advanced laser structures including gain coupled, distributed feedback multi-quantum well structures now provide greater efficiency for narrower linewidth emission, and wavelength selectivity in the range required for communications applications.

Semiconductor lasers from other direct bandgap materials of group II–VI are also being developed, but these devices emit at shorter wavelength than 1.3 µm and currently exhibit poor cw lifetimes.

Nevertheless, the vision of optoelectronics as integrating of optics and electronics onto the same substrate to provide optoelectronic integrated circuits (OEICs) is driving the search for improved and alternative laser light sources.

While GaAs integrated circuits surpass the performance of silicon based ICs for high frequency applications, their use is generally limited to specialized applications where higher performance and speed requirements offset manufacturing issues and relatively high manufacturing costs per unit.

Indeed, with improvements in advanced submicron BiCMOS, heterostructure devices, including SiGe alloys, silicon technology is currently competing with GaAs for some applications in telecommunications in the 1 to 5 GHz frequency range. Silicon technology is particularly attractive if performance requirements can be met, when taking into account the economies of scale in fabrication of high volume, relatively low cost silicon processing.

While hybrid OEICs would combine Si-based electronics and optical materials from direct bandgap III–V and II–VI-based alloys, there remains much speculation and uncertainty about the possibility of all silicon optoelectronics, i.e., monolithics in which each component comprises group IV materials. The doubt arises primarily from the fact that the crystal structures of silicon and other Group IV materials are generally indirect bandgap materials.

From the conventional undergraduate textbook viewpoint, the band structure of bulk group IV materials is characteristic of indirect band gap materials, which means that these materials do not emit light by a direct hole-electron recombination, except in phonon assisted transitions. That is, the •k=0 condition can be achieved by contribution of a phonon to conserve momentum with much longer lifetime than no phonon transitions which occur in direct bandgap materials. A longer lifetime is an inherent feature of indirect band gap materials, resulting in a lower probability of radiative emission. Thus, indirect bandgap materials, including silicon and silicon-germanium, have long been considered to be incapable of efficient light emission. There is much speculation as to how, if at all, a high efficiency silicon-based light source may be fabricated, let alone whether a laser could be fabricated.

Consequently observation of light emission from Si, SiGe, and SiGeC is a topic of worldwide curiosity. Light emission has been observed in rare earth doped Si and SiGe, strained quantum wells of SiGe, [100] nano-porous Si, nano-porous Ge, isoelectronic impurity doped SiGe, man-made Si columns and dots and nanocrystalline Si and Ge films, and Si quantum wire structures formed by lithography or other means.

Indeed, Japanese Patent Application No. 063310816A, published Nov. 4, 1994, speculates that stimulated emission may be obtained from an optically pumped silicon fine crystal comprising Si atom clusters having a diameter of 1–20 nm.

While the room temperature band gap of silicon is 1.14 eV, and of Ge is 0.67 eV, the band gap of strained $Si_{1-x}Ge_x$, alloys spans the range from 1.12 to 0.6 eV, i.e. 1.1 µm to 2 µm. Strain and quantum confinement effects shift optical emission to higher energies in very thin layers (see for example, Rowell et al. J. Appl. Phys. 74(4), p. 2795, Aug. 15, 1993). Thus silicon-germanium alloys are of considerable interest for silicon based optoelectronics for communication systems.

Research in the last five years has demonstrated increasingly efficient light emission from SiGe alloy/Si. One of the present inventors has been involved in the study of photoluminescence (PL) from epitaxial SiGe alloy/Si, being one of the researchers involved in first ever observation of PL from epitaxial SiGe alloy, which had an efficiency of 10% at 4K, as described in Appl. Phys. Letters 57 (10), pp. 1037–1039, Sep. 3, 1990. Low temperature PL was observed in the range 1.2 to 1.7 µm. This group also made the first demonstration of electroluminescence from strained SiGe alloys as described in Appl Phys. Lett. 58(9), Mar. 4, 1991, with emission in the 890 meV region. Electroluminescence from Si/Si$_{1-x}$Ge$_x$ multi quantum well pin diodes was observed in the range 1.35–1.55 μm with an internal quantum efficiency of at least 0.1%.

Very recently, Tang et al., in a publication in Electronics Letters Vol. 31, (16), pp. 1385–6, Aug. 15, 1995, reported fabrication and characterization of Si–Si$_{0.7}$Ge$_{0.3}$ light emitting diodes of •60 nm diameter[1], with emission of 1.312 μm, at room temperature, with an estimated internal quantum efficiency of about 3.5%, orders of magnitude higher than their as-deposited SiGe superlattice diode. The luminescence persisted to room temperature with 50% intensity of the 4.2K value. Tang postulated that the nano-fabrication process causes release of the as-grown pseudomorphic strain, which together with the etching induced formation of the SiGe alloy layer on the sidewalls of the dots will distort the original lattice and alter the lattice symmetry inside the small dots, which may help to convert the indirect bandgap to a direct bandgap, causing the improvement of optical efficiency.

[1] although these diodes are referred to as 'quantum dot" diodes, the term quantum dot structures more typically refers to elements whose dimensions are comparable or less than the confined carrier probability distribution, which is generally less than 200 Å; features with one or more dimensions exceeding 200 Å should therefore not be considered as quantum dots.

All of the approaches for improving radiative efficiency are based on restricting motion of carriers laterally within QWs through artificial micro-structuring or introduction of radiative binding centres.

The achievement of a practical laser diode from a group IV material remains sought after as a significant milestone in technological evolution of optoelectronics.

SUMMARY OF THE INVENTION

Thus the present invention seeks to provide a laser diode based on a group IV material, and particularly a laser diode compatible with silicon-based integrated circuits, and a method of fabrication thereof.

Thus, according to one aspect of the present invention there is provided a semiconductor laser device comprising:
   a substrate;
   an active region within a laser cavity formed on the substrate, the active region comprising a quantum well of an indirect band gap semiconductor material,
   the quantum well being divided laterally into a two dimensional array of cells,
   and means for creating a population inversion in the cells of the active region.

Thus a semiconductor laser device having an active layer comprising a quantum well of an indirect band gap material is provided. The quantum well is laterally subdivided into a two dimensional array of cells. This is achieved practically by defining two sets of intersecting grating grooves through the quantum well layer. The resulting grating structure functions not only to provide gain and index coupling, but to subdivide the quantum well into localized cells or islands of small dimensions. Subdivision of the quantum wells serves to isolate the deleterious effect of non-radiative recombination to specific cells, thereby enhancing the achievable population inversion overall. A two dimensional periodic array also provides for combined gain-coupled and index-coupled distributed feedback. Thus a semiconductor laser device structure is provided for obtaining stimulated emission and gain using an active layer comprising a quantum well of an indirect band gap material.

Beneficially, the active region comprises a multi-quantum well structure.

The indirect band gap material is provided by a layer of a group IV semiconductor material having a suitable band gap, for example, a quantum well layer of a silicon-germanium alloy, i.e., Si$_{1-x}$Ge$_x$, where x is selected to provide a predetermined band gap. Advantageously, the quantum well structure comprises a multi-quantum well SiGe alloy/Si layer structure, and the two dimensional grating comprises a double grating structure in two independent lateral directions (not necessarily orthogonal) which divides the multiple quantum layers into an array of "cells" of finite dimensions, which extend through the SiGe alloy quantum well structure, and in which the motion of free carriers is thus restricted or localized. That is, the carriers are localized within the quantum well layers, and laterally isolated by the 2 dimensional grating which defines the cell regions. This effect increases the probability of radiative recombination, in combination with the band broadening created by the finite dimensions of the cells, so that no-phonon transitions may occur, and increases the stimulated emission rate.

The periodicity of the grating structure may be selected to correspond to a Bragg reflection condition of the desired lasing wavelength, to provide combined gain-coupled and index-coupled distributed feedback of optical power along the direction of the laser cavity fabricated from group IV materials.

Alternatively, or additionally, by providing reflective facets to define the laser cavity comprising the active region, a laser having a Fabry-Perot configuration may be provided.

The grating grooves may be etched through all or part of the active region, and beneficially an isolating layer is provided on sidewalls of the cells of the active region. The isolating layer, e.g., a dielectric layer, is beneficial in providing a large step in index of refraction, assisting in reducing radiative recombination at the semiconductor-insulator interface, and in channelling of current through the quantum wells.

Means for creating a population inversion comprise electrical contacts for current injection into the active region. Alternatively, the semiconductor laser device may be capable of coupling to an external optical pump source to create a population inversion.

According to another aspect of the present invention there is provided a semiconductor laser diode comprising:
   a silicon substrate having defined thereon a layer of a first conductivity type, an active region within a laser cavity formed on the substrate, the active region comprising at least one quantum well of an indirect bandgap material, and a layer of a second conductivity type,
   the active region being laterally subdivided into a two dimensional array of localized cells,
   and first and second contact regions for current injection into the active region for achieving a population inversion in cells of the active region.

Another aspect of the present invention provides a gain coupled distributed feedback laser diode comprising:
   a substrate comprising a semiconductor layer of a first conductivity type and a semiconductor layer of a second conductivity type, and disposed therebetween an active region on the substrate comprising a silicon/silicon-germanium multi-quantum well structure;
   a two dimensional grating structure defined through the active region, the grating thereby defining an array of cells of finite dimensions within the quantum well structure, said dimensions being selected to provide carrier localization within the cells, and the periodicity of the grating also providing gain coupling and distributed feedback in operation of the device at a selected wavelength.

According to yet another aspect of the present invention there is provided a gain coupled distributed feedback laser diode comprising:

a substrate, an active region on the substrate comprising a Group IV semiconductor and a Group IV semiconductor alloy multi-quantum well structure having a two dimensional grating structure defined through the active region;

the grating defining an array of cells of finite dimensions within the quantum well structure, said dimensions being selected to provide carrier localization within the cells, and the periodicity of the grating in at least one direction providing gain coupling and distributed feedback in operation of the device at a selected wavelength of emission from the active layer.

According to another aspect of the present invention there is provided a method of fabricating a laser diode comprising the steps of providing a substrate, forming thereon a quantum well of an indirect bandgap semiconductor material, and laterally dividing the quantum well into a two dimensional array of cells, preferably by defining intersecting sets of grating grooves through the quantum well layer. Preferably, the quantum well layer is provided by a group IV semiconductor alloy material. Practically a multi-quantum well structure, for example a silicon-germanium alloy/silicon multi-quantum well structure is fabricated on a silicon semiconductor substrate.

Thus the method is compatible with known ultra high vacuum (UHV) chemical vapour deposition (CVD) processes, for example, for fabricating SiGe alloy quantum well structures on silicon substrates. The method may be adapted to form a laser device from other group IV alloy materials.

BRIEF DESCRIPTION THE DRAWINGS

Embodiments of the invention will now be described by way of example, with reference to the accompanying drawings, in which.

DESCRIPTION OF THE PREFERRED EMBODIMENTS

Figure 1:
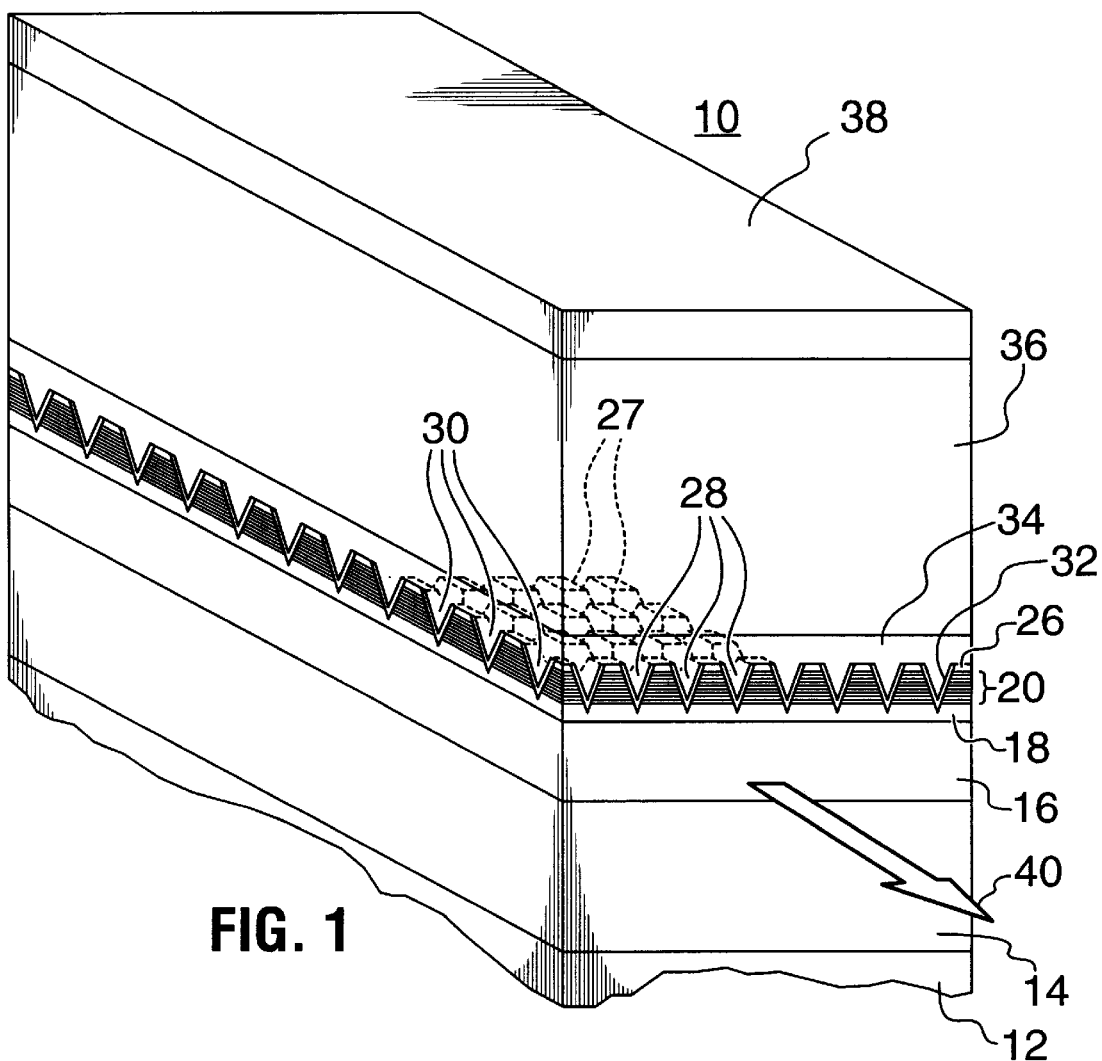
FIG. 1 shows a schematic diagram of part of a semiconductor laser device structure according to a first embodiment of the present invention.
Figure 3:
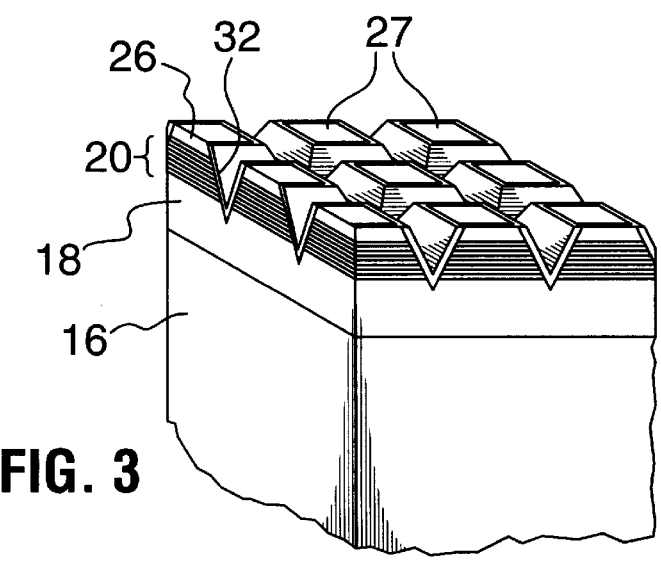
FIG. 3 shows an enlarged view of a part of a partially fabricated semiconductor laser device structure represented by FIG. 1, detailing the double intersecting grating structure.
Figure 2:
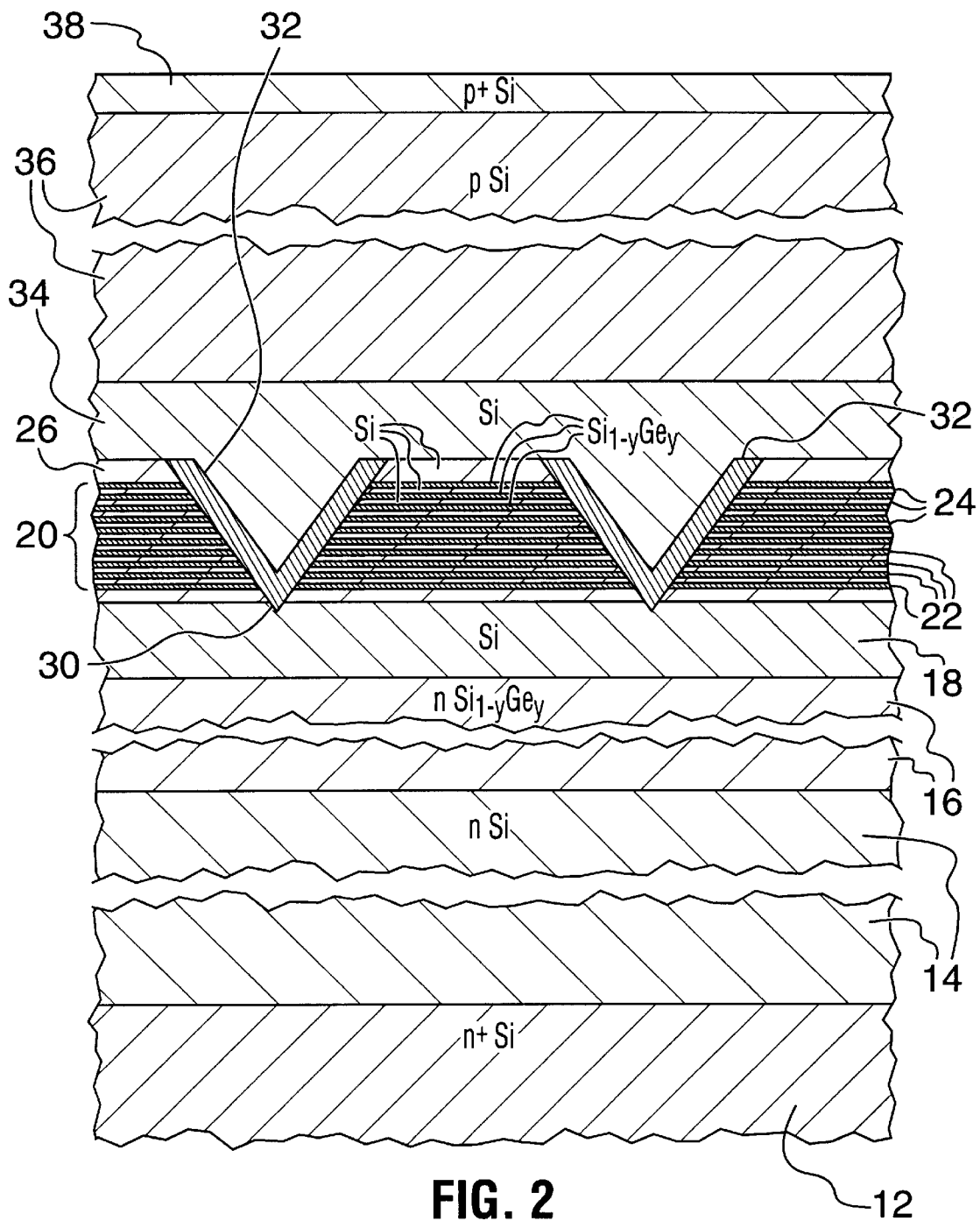
FIG. 2 shows an enlarged schematic cross sectional diagram detailing part of the layer structure of FIG. 1.

A semiconductor laser device 10 according to a first embodiment of the present invention is shown schematically in FIG. 1, and FIG. 2 shows an enlarged schematic cross-section of part of the structure of FIG. 1. FIG. 3 shows a partially fabricated part of the structure of FIG. 1. The semiconductor laser device 10 is fabricated from Group IV semiconductor materials, and comprises an active layer 20 within a laser cavity formed on the substrate 12, the active layer 20 comprising a quantum well of an indirect band gap material, i.e., comprising a SiGe alloy/Si quantum well structure. The semiconductor laser device comprises a heavily N doped (100) silicon substrate 12, on which is defined an N doped silicon buffer layer 14 with a doping level lower than the substrate doping level. An optional waveguiding layer 16 comprising a SiGe alloy layer, e.g., a $Si_{1-y}Ge_y$ where y is≈0.05, is provided as a design optimization. A silicon spacer layer 18 is provided over the waveguiding layer 16. The active region overlies the spacer layer 18 and comprises a multi-quantum well (MQW) structure 20 which includes, for example, twelve periods of an undoped SiGe/Si quantum well layer structure comprising alternating layers 22 of SiGe alloy of a selected composition, e.g., $Si_{1-x}Ge_x$ where x≈0.30 (i.e., $Si_{0.70}Ge_{0.30}$), and layers 22 of Si, each layer being e.g., 30 Å thick. (Note that the Ge content x is greater than y of the waveguiding layer.) The alloy composition and layer thicknesses of the MQW structure 20 are tailored to provide specific band gap energies, to provide for lasing at a required wavelength. Increasing the number of quantum wells provides higher gain per unit length of the laser cavity. A limitation to the number of quantum wells with a specific composition is imposed by the critical thickness before formation of dislocations, which would be detrimental to device performance and/or reliability. A cap layer 26 of undoped silicon is formed on top of the quantum well structure 20. A two dimensional gain grating structure is patterned through the active region, that is, through the multi-quantum well structure to form a grating structure as shown schematically in FIG. 1. The two dimensional grating, comprising coplanar sets of intersecting grooves 28 and 30, is defined through the quantum well layers to the underlying undoped Si spacer layer 18. A cross sectional view of part of the layer structure of FIG. 1 is shown on an enlarged scale in FIG. 2. Two intersecting sets of grating grooves are provided to define an active region comprising an array of cells, each cell 27 comprising a MQW structure, as shown schematically in FIG. 3, which shows part of the structure, up to layers in which the grating is defined. In this example the grating period is the same for both gratings and the gratings are orthogonal. The grating period is nominally on the order of 100 nm. In the laser cavity direction (i.e., in the direction of arrow 40 in FIG. 1), for lasing to occur, the grating period is determined by an integer multiple of $\lambda/2n$ where $\lambda$ is very close to the desired lasing wavelength, (typically within 5 nm), and n is the refractive index of the material, i.e., ~3.5 for SiGe. Thus, for example, a first order grating is fabricated with a period of 188 nm (for $\lambda \approx 1.32$ $\mu$m).

The V grooves are provided by an etch selective to revealing the {111} planes of the structure which are inclined at 54.4° to the (100) surface, as will be explained below.

A layer of insulating and passivating material 32 e.g. $SiO_2$, lines the {111} planes of the grating grooves which define sidewalls of each cell, and a layer of silicon 34 fills the grating grooves. An upper silicon cladding layer 36, and a $P^+$ top contact layer 38 completes the structure. The substrate provides an $N^+$ contact layer. Electrical contacts (not shown) to the $P^+$ layer and $N^+$ substrate are provided in a conventional manner. The insulating layer 32 is beneficial in three respects: for providing a large step in the index of refraction for the grating, to reduce the carrier recombination velocity at the semiconductor-insulator interface to minimize non-radiative recombination, and to provide effective channeling of all current through the quantum wells.

Thus a gain-coupled two-dimensional grating DFB laser device is provided. The two intersecting gratings, which in this case are orthogonal at 90°, define isolated regions or "cells" of the Si/SiGe multi-quantum well structure which have micro-structural dimensions, i.e., up to the grating period ≈185 nm. Nevertheless these structures are significantly larger than the light emitting silicon based nano-structures and structures referred to as quantum dots in the above mentioned references.

Thin film lasers using two dimensional gratings are analyzed in articles by Shyh Wang et al., Appl. Phys. Lett., Vol. 22 No. 9, May 1, 1973 entitled "Two dimensional distributed feedback lasers and their applications" and in Sov. J. Quantum Electron. 9(4) April 1979 by Luk'yanova et al. entitled "Thin film laser with a two dimensional diffraction grating". In a more recent reference by Evans et al, "Crossed gratings for semiconductor lasers", IEEE 13th SCCD Conference 1992 (Japan), a non-orthogonal grating was used to provide an effective periodicity smaller than either of the individual gratings. However, these double grating structures have remained a curiosity in III–V light emitting materials because one dimensional grating structures have provided efficient light emission and lasers.

In the present laser diode, the two dimensional grating serves a dual function. Firstly, the grating provides gain and index coupling in a DFB laser as described in the latter references. Secondly, the grating also subdivides the quantum well structure into cells, or islands, of small dimensions, which create carrier localization. The latter effect shortens carrier lifetimes sufficiently to obtain stimulated emission from an indirect band gap material, as explained below.

Figure 4A:
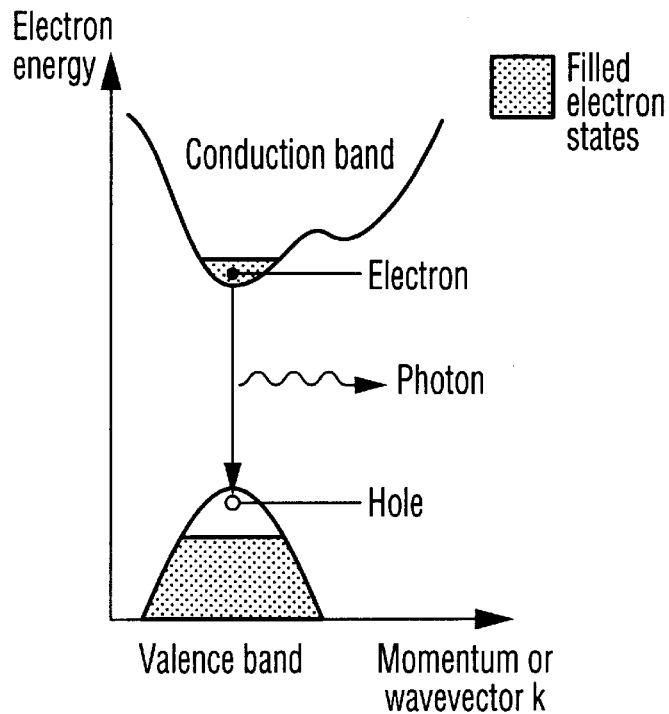
FIGS. 4A and 4B shows schematic diagrams of the energy vs. wavevector relationship for a direct and indirect bandgap semiconductor (infinite lattice), respectively.
Figure 4B:
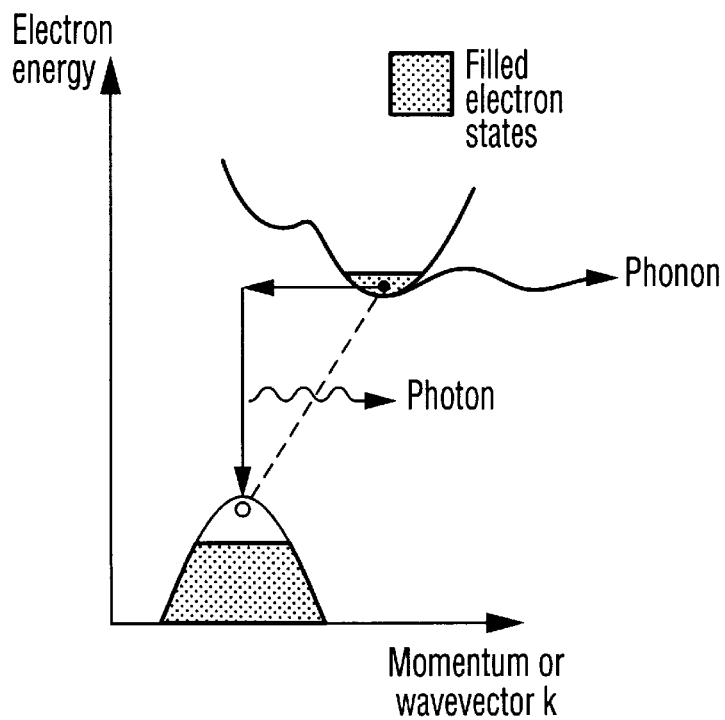
Figure 5:
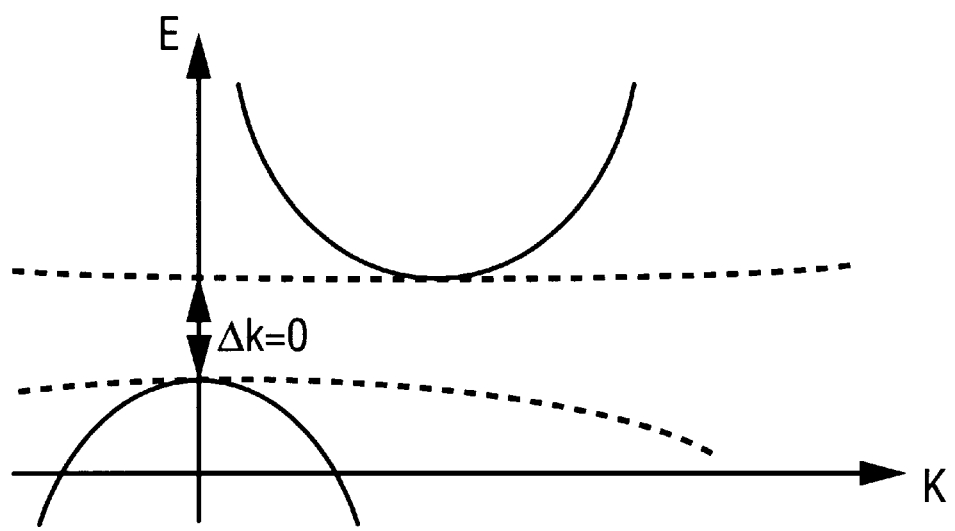
FIG. 5 shows a schematic diagram of the band structure for an indirect band gap semiconductor (infinite lattice), and for an indirect bandgap semiconductor for a finite lattice of limited spatial extent.

In fact, the inherent feature of an indirect gap semiconductor is not that it exhibits inefficient light emission, but that the carrier lifetime is orders of magnitude greater than for direct gap material due to the requirement for phonon involvement, thereby allowing for sufficient time for the carriers to diffuse randomly in the material until they interact with a non-radiative defect site, even if these sites are present in concentrations below $10^{14}$ cm$^{-3}$. This limitation can be overcome by restricting motion of the carriers in the quantum wells to small localized cells, thereby greatly reducing the probability that carriers can interact with a non-radiative defect site. In the growth direction of the MQW structure, the valence band discontinuity of SiGe with Si serves to trap holes in the SiGe layer. Restriction of motion of carriers in the lateral direction can be achieved by etching a pattern, e.g., a grating grid as described above, through the QWs to define the cell size. Passivation of the exposed surface of the QW reduces the carrier surface recombination velocity. While trapped in such cells, the carriers have no option, other than to undergo radiative recombination, or, if the carrier density in a given cell becomes exceedingly high, Auger recombination (non-radiative). In this respect the entrapment of carriers within a cell is not a "quantum confinement", but rather a localization of carriers which depends on the size of the cells being sufficiently small to provide for a large proportion of cells which do not contain a non-radiative centre. Thus, in this context, cells without a non-radiative centre are called "active" cells. The purer the material, therefore, the larger the cell size can be to achieve a given emission efficiency. In theory, since Si and SiGe are indirect bandgap materials, the participation of a phonon is also required for radiative emission (see FIG. 4). The description of indirect gap semiconductors having non-aligned band extrema in k-space is derived from the Bloch theory, with the tacit assumption of an infinite lattice, i.e. bulk material. On the other hand, when carriers are restricted in their ability to diffuse randomly throughout the material, as described above, by trapping or localization in sufficiently small cells, the Bloch treatment does not apply. Consequently, the energy dispersion relationships, that is band energy as a function of carrier momentum k (E vs. k), are broadened considerably (see FIG. 5). Thus, no phonon ($\Delta k=0$ or pseudo-direct band gap) transitions may occur. Correspondingly, the carrier lifetime is reduced, and radiative efficiency increases. More importantly, it provides the basis for achieving stimulated emission.

The three necessary and sufficient conditions for obtaining laser action (stimulated emission, with amplification) from any material, be it solid or gaseous, are thus satisfied for the laser diode structure discussed above. Population inversion is achieved by the carrier entrapment noted above, to reduce the probability of non-radiative transitions. Stimulated emission is achieved as a result of band broadening. Optical feedback may be obtained by a Fabry Perot geometry, i.e., by introducing suitable reflective facets, in combination with the grating structure. Advantageously, optical feedback is obtained within the resonant cavity, as described above, by using the coplanar double grating structure to provide distributed feedback. In this case, the grating period in the direction of the laser cavity must satisfy a Bragg reflection condition for the intended laser wavelength.

The device structure is gain coupled by the periodic gain/no gain structure of the grating, and supports a laser mode having a standing wave with maxima predominantly situated on the points of highest gain, i.e., one mode is very favourably situated with respect to grating structure.

While the laser diode described above is fabricated on an N type substrate wafer, alternatively, a complementary structure may be fabricated on a P type wafer.

The waveguiding layer 16 of SiGe alloy underlying the active layer was provided as a design optimization, but optionally may be omitted.

The two dimensional grating structure described above comprises 2 sets of coplanar, orthogonal V grooves which truncate in the silicon spacing layer underlying the QW structure. In modifications of this embodiment, the V grooves extend only partly through the QW structure. The passivation layer within the grooves serves to redirect current through the cells. Moreover, during growth of the overlying silicon layer which fills the V grooves, silicon grown on the active region will be single crystal, but silicon grown on the passivation layer will be polycrystalline. The latter, having higher resistivity, will further assist in directing current through the crystalline silicon and through the active region.

Figure 6:
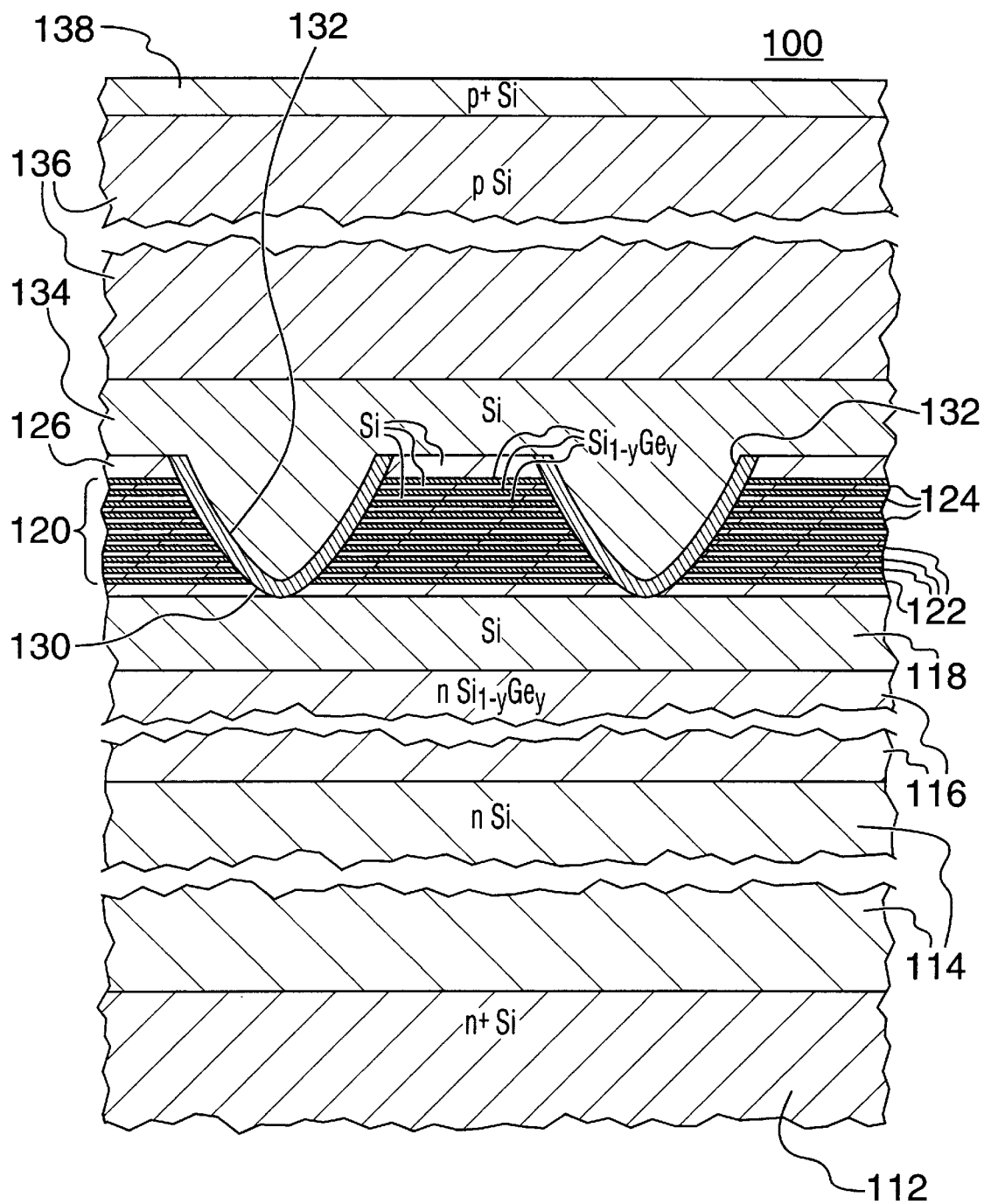
FIG. 6 shows a schematic cross sectional diagram showing part of the layer structure of a semiconductor laser device according to a second embodiment.

In a semiconductor laser 100 according to a second embodiment, the laser structure is similar to that of the first embodiment except for the profile of the grating grooves, which are formed by a dry etching method, i.e., by etching in a plasma. Instead of profile which is V shaped with a sharp vertex, resulting from a chemical etch process as described above, the dry etch process results in a groove 130 having a V shape with a rounded vertex, as illustrated schematically in FIG. 6. To facilitate comparison with FIG. 1, corresponding layers of the structure are denoted by the same reference numerals, incremented by 100.

In a semiconductor laser of an alternative embodiment (not shown), a rectangular grating is provided, e.g., as provided by highly anisotropic reactive ion etching. It is expected to be more difficult to provide selective passivation on the bottom 100 surface of a rectangular groove compared to the 100 top surface. Lack of passivation on the bottom of the groove would allow current leakage through the groove, reducing efficiency of channelling of current through the active area.

The functional requirements for the grating structure, i.e., for subdividing the quantum well structure to provide localization of carriers, may be met with any suitable 2 dimensional grating structure, providing also that the grating periodicity in at least one dimension provides for a Bragg condition for distributed feedback to provide for lasing in the direction of the laser cavity. Thus alternative 2 dimensional grating configurations, e.g., a circular grating comprising concentric grooves which are subdivided radially into sections, may be contemplated. Nevertheless, more complex grating configurations may present more practical problems in their fabrication.

In a semiconductor laser device according to another embodiment, reflective facets are provided to define a laser cavity having a Fabry Perot configuration.

In this embodiment, it is not necessary for the grating period to match the Bragg condition to provide distributed feedback and thus the grating need only provide the function of dividing the quantum well structure into the two dimensional array of isolated cells.

In the embodiment described above, the heavily doped substrate provides an $N^+$ contact layer. In alternative embodiments the substrate need not be heavily doped, if all electrical contacts are provided on the top (processed) surface of the waver where the active region is located.

The semiconductor lasers of the embodiments described above are semiconductor diode laser structures, i.e., have contacts for electrical excitation of the active layer by current injection. It is also contemplated that a semiconductor laser device of yet another embodiment may be provided with optical pump means, e.g., by providing population inversion with suitable optical coupling to a another light source on the substrate.

FABRICATION

The Si/SiGe alloy laser diode structure of the first embodiment described above may be fabricated by adaptation of known methodology for fabrication of laser diode structures using III–V materials, by providing suitable processes for fabricating and defining layers of the required group IV, Si and SiGe alloy materials by UHV-CVD methods developed for fabrication of known SiGe alloy quantum well structures. For example, the following process provides a practical method of implementing the structure of the embodiment described in detail above.

In a method of fabricating the semiconductor laser device structure according to the first embodiment, a semiconductor silicon substrate, e.g., heavily doped n-type (100) silicon, e.g. As doped $1\times10^{19}$ cm$^{-3}$ or greater, is suitable. If required the substrate is cleaned by a conventional method, and dipped in 1% HF, (a DI water rinse and $N_2$ spin or blow dry was omitted) to render the surface hydrophobic.

Fabrication of the double grating laser diode structure proceeds in 5 stages as follows:
1. first epitaxial growth of substrate and quantum well layers;
2. patterning of the grating structure;
3. passivation of the grating structure,
4. second epitaxial growth of overlying layers;
5. completion of laser fabrication (e.g., ridge formation, contacts).

The prepared substrate is loaded promptly into a commercially available UHV-CVD reactor and a buffer layer of n-type silicon is grown thereon, i.e., 2.5 μm n-type $1\times10^{17}$ cm$^{-3}$ phosphorus doped silicon, grown at 550° C., e.g., from a conventional reactant mixture of silane and a phosphorous source e.g. phosphine. Growth is terminated by suspending the reactive gas flows, and ultra high vacuum is re-established in the reactor. The growth temperature is reset to 525° C. and once a steady state temperature is reached growth is resumed to provide a layer of silicon-germanium with $1\times10^{17}$ phosphoris doping is grown thereon, to provide a waveguiding SiGe layer. The SiGe layer is grown by a known method, using reactive gases comprising silane and germane in the required proportions. The waveguiding SiGe layer is preferably about 1600 Å thick of an alloy of composition $Si_{0.95}Ge_{0.05}$ to provide the required bandgap and refractive index. An overlying layer of undoped silicon is then provided to form a bottom spacer layer, about 400 Å, thick. Overlying the spacer layer, a series of undoped active QWs are grown, that is, as shown in FIG. 1: 12 quantum wells comprising layers of 30 Å $Si_{0.70}Ge_{0.3}$, with 11 corresponding intervening barrier layers of 30 Å Si. An undoped silicon top spacer layer 100 Å thick is formed thereon. The layer thicknesses of the Si/SiGe alloy quantum well stack are predetermined to provide the required band gap for light emission at a predetermined wavelength, in this example, at ~1.3 μm to 1.5 μm. Other factors taken into consideration include the strain/thickness product limit, e.g., as discussed in an article by D.C. Houghton et al, J. Appl. Phys. Vol. 70, p. 2136, 1990.

GRATING FABRICATION

The resulting structure is provided with a thin etch masking layer of a layer of silicon dioxide for reasons to be explained below, and then e.g., coated with photoresist and patterned in a conventional manner to define the required grating pattern. That is, photoresist is spin coated onto the wafer and baked. The resist coated wafer is mounted in a laser holography system with the major flat on the alignment jig and exposed to He:Cd laser radiation at λ=325 nm to define a first grating having a grating period of 188 nm. The wafer is rotated 90° and exposed to define a second grating. The second grating may have the same period as the first grating, as described in the structure of the first embodiment. Alternatively a different grating period may be used. The photoresist is developed, and the resulting photoresist pattern is used as a mask for a subsequent etching to transfer the grating pattern into the oxide layer. The exposed regions of thin protective mask layer of silicon dioxide are removed by a known method, e.g., reactive ion etching using a $CF_4/H_2$ plasma. The grating etch into the QW layers is then performed using an anisotropic, etch. To form a grating having V grooves, an etch which is selective to reveal the {111} planes of the Si/SiGe alloy semiconductor crystal structure is required. For example, an anisotropic wet etch process is described in U.S. Pat. No. 3,765,969 entitled "Precision etching of semiconductors" by Kragness et al. which uses an aqueous solution of n-propanol and an alkali hydroxide. The anisotropic etch process provides an V groove etch, which reveals the {111} planes inclined 54.5° to the (100) etch surface, the etch being self terminating on the {111} planes. The silicon dioxide mask layer protects top of the grating structure during etching.

Thus two coplanar intersecting sets of V grooves 28 and 30 are defined through the MQW structure as shown schematically in FIGS. 1 and 3. The deepest point (vertex) of the V-groove, after the etch is complete, is ideally located within the Si bottom spacer layer 18 as shown in FIG. 3. That is the etch cuts right through the SiGe quantum well structure to the underlying silicon spacer layer. The oxide is stripped in a 1% HF dip, as noted above for substrate surface preparation, to remove the oxide layer and to provide a hydrophobic surface. Drying by spinning or blowing $N_2$ may be used if required to remove etchant from the grating grooves.

A passivation layer 32 is then provided on the {111} facets of the grooves. For example, suitable passivation may be achieved by thermal oxidation at a maximum temperature of about 550° C., to provide a thin thermal silicon dioxide layer with a low density of interface traps. The structure is then transferred to a plasma enhanced CVD (PE-CVD) system and a further thickness of a good dielectric is deposited thereon by low temperature plasma deposition. e.g. 200 Å of $SiO_2$ deposited at 300° C.

The structure is then anisotropically etched, e.g., by reactive ion etching in a $CF_4$ plasma, to remove the top 200 Å $SiO_2$ passivation from the substrate surface, leaving a thin oxide 32 on the {111} surfaces. For example, the remaining thickness on the {111} surfaces will be $(2^{1/2}-1)$ 200 Å=83 Å.

EPITAXY SECOND GROWTH

After the dielectric etch to provide a dielectric passivation layer 32 on the {111} surfaces of the grooves 28 and 30 which define sidewalls of the cells, the surface is again cleaned by a 1% HF dip, as described above to provide a hydrophobic Si surface. After spinning or blowing dry in N2, the wafer is loaded promptly into the UHV-CVD reactor and another layer 34 of undoped silicon is grown over the top of the grating teeth, e.g., 300 Å to 500 Å of undoped silicon grown at 550° C. CVD silicon deposited over the original exposed Si (100) surface should be a single crystal epitaxial layer. Si deposited on the oxide coated (111) faces is expected to be polycrystalline. The silane flow rate vs. time is optimized to provide that single crystal silicon growth dominates the polycrystalline growth regions as the thickness of the deposited film increases and fills the grating grooves. Consequently the crystalline silicon regions gradually converge over regions of polycrystalline silicon filling the grooves, to provide an overlying crystalline silicon layer 34.

Where the second growth phase is carried out at low temperature, the growth phase may be slow, and another method of depositing silicon at low temperature, e.g. PECVD deposition of α-silicon at 300° C. may be preferable.

After filling the grating grooves and depositing a further 300 Å to 500 Å of silicon above the grating teeth, a layer of p-type silicon 36, i.e., about 2.9 μm of p-type boron doped $1.0 \times 10^{17}$ cm$^{-3}$ is deposited thereon. Finally, a conductive contact layer of heavily doped silicon, e.g. p$^+$boron doped, silicon ($1 \times 10^{20}$cm$^{-3}$) is formed thereon.

Laser fabrication is then completed using a standard process. For example, to form a ridge waveguide laser, a ridge mask is provided on the substrate, and the substrate is etched to define ridges. A sidewall dielectric is deposited thereon, vias are etched through the dielectric on top of the ridges, and a top metal contact layer is deposited. The backside of the wafer is lapped and polished, and backside metal contacts are provided by a conventional method.

In this structure, it is desirable to have the top contact further from the active region, i.e., greater than 2 μm typically used for a ridge structure, to distance the laser mode from the top contact region. Thus, preferably, ridges are defined having a ridge depth of 2.5 μm to 2.9 μm, somewhat deeper than that generally used in conventional ridge waveguide lasers.

Thus a laser diode structure is provided comprising a double grating structure defined by intersecting coplanar grating grooves etched throughout the SiGe MQW structure as shown schematically in FIG. 1. The grating grooves are preferably passivated with a good dielectric layer, e.g., comprising silicon dioxide, or silicon nitride. Preferably, the dielectric provides a high degree of passivation and assists in channeling current through the quantum well regions.

Filling of the grating grooves with undoped semiconductor having a suitable bandgap offset, e.g., a SiGe alloy [analogous to use of a semi-insulating current blocking layer in fabrication of III–V laser diode structures] is not expected to be as effective as using a good dielectric. For example, a SiGe alloy would localize only holes, not electrons, and since group IV semiconductors have lower resistivities than group III–V materials, it is expected that current channeling through the active regions would not be as effective.

In fabrication of semiconductor laser device structures according to alternative embodiments, the grating structure may alternatively be defined by a suitable dry etching process, to produce grating grooves of alternative shapes, e.g., anisotropic reactive ion etching with a halogen-containing plasma. The latter process may be used to define gratings having rectangular groove structures.

As mentioned above, although the traditional arrangement for laser diode structures is N side down, a complementary structure, i.e., reversed N and P layers may alternatively be used.

In selecting an indirect bandgap material for the active layer, a SiGe alloy provides the particular advantage of providing emission in the required spectral region for communications applications. Other group IV alloy materials, e.g. SiGeC alloys may also form suitable active layers for the QW layers. Other potential alloy materials from group IV may include, for example GeSn, SiSn.

Thus, it will be appreciated that, while specific embodiments of the invention are described in detail above, numerous variations and modifications of these embodiments fall within the scope of the invention as defined in the following claims.

What is claimed is:

1. A semiconductor laser device comprising:
   a group IV semiconductor substrate;
   an active region within a laser cavity formed on the substrate, the active region comprising a quantum well layer of a Group IV indirect band gap semiconductor alloy material selected for operation of the device at a laser wavelength λ;
   the quantum well layer being divided laterally into a two dimensional array of cells of dimensions $\leq \lambda/2n$ where n is the refractive index of the alloy material, to provide carrier localization within the cells;
   the two dimensional array of cells defined by two intersecting sets of coplanar grating grooves etched through at least part of the active region;
   an isolating layer of dielectric provided on sidewalls of the cells of the active region; and
   means for creating a population inversion in the cells of the active region.

2. A semiconductor laser device according to claim 1 wherein at least one set of grating grooves is periodic.

3. A semiconductor laser device according to claim 1 wherein the periodicity of one set of grooves provides for distributed in the laser cavity direction.

4. A semiconductor laser device according to claim 1 wherein reflective facets define ends of the laser cavity containing the cells of the active region and provide for optical gain within the laser cavity.

5. A semiconductor laser according to claim 1 wherein the intersecting sets of grating grooves are orthogonal.

6. A semiconductor laser according to claim 1 wherein the grating grooves are V grooves.

7. A semiconductor laser according to claim 1 wherein the grating grooves containing a current blocking material.

8. A semiconductor laser device comprising:
a group IV semiconductor substrate; an active region within a laser cavity formed on the substrate, the active region comprising a series of quantum wells of a group IV indirect bandgap semiconductor alloy material separated by barrier layers, the Group IV indirect bandgap semiconductor alloy material selected for operation of the device at a laser wavelength $\lambda$; the quantum wells being divided laterally into a two dimensional array of cells of dimensions $\leq \lambda/2n$ where n is the refractive index of the alloy material, to provide carrier localization within the cells;
and means for creating population inversion in the cells of the active region.

9. A semiconductor laser device according to claim 8 wherein the quantum well layers comprise a silicon containing alloy and the barrier layers comprise silicon.

10. A semiconductor laser device according to claim 8 wherein the quantum well layers comprise a silicon germanium alloy and the barrier layers comprise silicon.

11. A semiconductor laser device according to claim 8 wherein the indirect bandgap material comprises a silicon-germanium alloy of composition $Si_{1-x}Ge_x$ where x is selected to provide a predetermined band gap.

12. A semiconductor laser device according to claim 8 wherein means for creating a population inversion comprises electrical contacts for current injection into the active region.

13. A semiconductor laser device according to claim 8 capable of being coupled to an external optical pump source for creating a population inversion.

14. A semiconductor laser device according to claim 8 wherein the two dimensional array of cells is defined by two intersecting sets of grating grooves etched through the active region.

15. A semiconductor laser device according to claim 14 wherein at least one set of grating grooves is periodic.

16. A semiconductor laser device according to claim 14 wherein the periodicity of one set of grooves provides for distributed feedback in the laser cavity direction.

17. A semiconductor laser according to claim 14 wherein the grating grooves are V grooves.

18. A semiconductor laser according to claim 14 wherein an isolating layer of dielectric is provided on sidewalls of the cells of the active region.

19. A semiconductor laser according to claim 14 wherein the grating grooves contain a current blocking material.

20. A semiconductor laser according to claim 19 wherein the current blocking layer comprises a passivating layer of dielectric.

21. A semiconductor laser according to claim 14 wherein a current blocking layer is provided on sidewalls of the cells.

22. A semiconductor laser device according to claim 8 wherein the intersecting sets of grating grooves are orthogonal.

23. A semiconductor laser according to claim 8 wherein reflective facets define ends of the laser cavity containing the cells of the active region and provide for optical gain within the cavity.

24. A semiconductor laser diode comprising:
a silicon substrate having defined thereon a layer of a first conductivity type, an active region within a laser cavity formed on the substrate, the active region comprising a quantum well layer of a Group IV indirect band gap semiconductor alloy material selected for operation at a laser wavelength $\lambda$;
the quantum well layer being divided laterally into a two dimensional array of cells of dimensions of ~100 nm to provide carrier localization within the cells;
and means for creating a population inversion in the cells of the active region.

25. A semiconductor laser diode according to claim 24 wherein the active region comprises a plurality of quantum well layers of the indirect bandgap material separated by barrier layers.

26. A semiconductor laser diode according to claim 25 wherein the grating structure providing for distributed feedback in the laser cavity direction.

27. A semiconductor laser diode according to claim 25 wherein reflective facets define the laser cavity and provide for optical feedback and gain within the laser cavity.

28. A semiconductor laser diode according to claim 25 wherein the grating structure comprises two sets of intersecting grooves etched through the quantum wells of the active region.

29. A semiconductor laser diode according to claim 24 wherein the array of cells of active region are defined by a two dimensional intersecting grating structure defined through the active region.

30. A semiconductor laser diode according to claim 24 wherein the indirect bandgap material comprises a silicon-germanium alloy.

31. A laser diode according to claim 24 wherein indirect bandgap material comprises a silicon-germanium alloy of composition $Si_{1-x}Ge_x$ where x is selected to provide a predetermined band gap.

32. A semiconductor laser diode according to claim 24 wherein the active region comprises a multi-quantum well structure comprising a series of alternating layers of an indirect band gap semiconductor material and quantum well layers comprising an alloy of said semiconductor material.

33. A semiconductor laser diode according to claim 24 including means for gain coupling comprising a periodic grating structure having a period in a direction of the laser cavity determined by the Bragg wavelength of the required laser wavelength.

34. A gain coupled distributed feedback laser diode comprising:
a substrate comprising silicon semiconductor layer of a first conductivity type and a silicon semiconductor layer of a second conductivity type, and disposed therebetween an active region on the substrate comprising a silicon/silicon germanium alloy multi-quantum well structure having a band gap selected for operation at a laser wavelength $\lambda$;
a two dimensional grating structure defined through the active region, the grating thereby defining an array of cells within the multi-quantum well structure of dimensions $\leq \lambda/2n$ where n is the refractive index of the quantum well alloy, said dimensions being selected to provide carrier localization within the cells, and the periodicity of the grating also providing gain coupling and distributed feedback in operation of the device at the selected wavelength $\lambda$.

35. A laser diode according to claim 34 wherein the substrate is a semiconductor layer of a first conductivity type and a semiconductor layer of a second conductivity overlies the active region, and first and second contacts are provided to the layers of the first and second conductivity types for current injection.

36. A laser diode according to claim 34 wherein sidewalls of the cells are passivated with a layer of dielectric.

37. A laser diode according to claim 34 wherein the layer of the second conductivity type defines a current confining ridge over the active region.

38. A laser diode according to claim 34 wherein the substrate comprises a waveguiding layer underlying the active layer.

39. A laser diode according to claim 34 wherein the waveguiding layer comprises a layer of silicon germanium alloy.

40. A laser diode according to claim 34 wherein the silicon germanium alloy comprises an alloy of composition $Si_{1-x}Ge_x$ where x is selected to provide a required band gap.

41. A laser diode according to claim 40 wherein the grating grooves are V grooves.

42. A laser diode according to claim 40 wherein the substrate surface is 100 and facets of V grooves are 111.

43. A laser diode according to claim 34 wherein the two dimensional grating structure comprises two intersecting sets of grating grooves etched through the active region.

44. A laser diode according to claim 34 wherein the grating grooves are filled with a current blocking material.

45. A laser diode according to claim 34 wherein sidewalls of the cells are coated with a current blocking material.

46. A gain coupled distributed feedback laser diode comprising:

a substrate, an active region within a laser cavity formed on the substrate, the active region comprising a Group IV semiconductor and a Group IV semiconductor alloy multi-quantum well structure, selected for operation at a laser wavelength $\lambda$, having a two dimensional grating structure defined through the active region;

the grating defining an array of cells within the quantum well structure, of dimensions $\leq \lambda/2n$ where n is the refractive index of the alloy material, said dimensions being selected to provide carrier localization within the cells, and the periodicity of the grating in at least one direction providing gain coupling and distributed feedback in operation of the device at a selected wavelength of emission from the active layer.

* * * * *